(12) United States Patent
Verschuuren et al.

(10) Patent No.: US 8,536,600 B2
(45) Date of Patent: Sep. 17, 2013

(54) PHOTONIC CRYSTAL LED

(75) Inventors: Marcus Antonius Verschuuren, Eindhoven (NL); Hendrik Adrianus Van Sprang, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 305 days.

(21) Appl. No.: 12/747,541

(22) PCT Filed: Dec. 12, 2008

(86) PCT No.: PCT/IB2008/055249
§ 371 (c)(1),
(2), (4) Date: Jun. 11, 2010

(87) PCT Pub. No.: WO2009/081314
PCT Pub. Date: Jul. 2, 2009

(65) Prior Publication Data
US 2010/0270572 A1   Oct. 28, 2010

(30) Foreign Application Priority Data
Dec. 18, 2007   (EP) ...................................... 07123466

(51) Int. Cl.
*H01L 33/16* (2010.01)
(52) U.S. Cl.
USPC ..................................... 257/98; 257/E33.068
(58) Field of Classification Search
USPC .............................. 257/98, E33.067, E33.068
See application file for complete search history.

(56) References Cited

U.S. PATENT DOCUMENTS

| 7,173,289 | B1 | 2/2007 | Wu et al. | |
| 2005/0173714 | A1 | 8/2005 | Lee et al. | |
| 2006/0062540 | A1 | 3/2006 | Zoorob et al. | |
| 2006/0192217 | A1 | 8/2006 | David et al. | |
| 2006/0204865 | A1* | 9/2006 | Erchak et al. | 430/7 |
| 2006/0284187 | A1 | 12/2006 | Wierer, Jr. et al. | |
| 2007/0085100 | A1 | 4/2007 | Diana et al. | |
| 2007/0257269 | A1* | 11/2007 | Cho et al. | 257/95 |

FOREIGN PATENT DOCUMENTS

| EP | 1624499 A2 | 2/2006 |
| WO | 2006110535 A2 | 10/2006 |

* cited by examiner

*Primary Examiner* — Wensing Kuo

(57) ABSTRACT

A semiconductor light emitting diode (1, LED), comprising a first and a second electrode (40, 11) for applying a voltage across an active region (4) for generation of light, a light emitting surface (6), and a plurality of photonic crystals (101, 102). Further, at least two photonic crystals (101, 102) of a first and a second type are adapted to extract light from the active region (4) and differ from each other with respect to at least one lattice parameter. Each of said at least two photonic crystals (101, 102) are associated with a respective far field pattern, wherein an arrangement of said plurality of photonic crystals (101, 102) is provided to arrange said at least two photonic crystals (101, 102). In this manner, a far field pattern is created by combining the respective far field patterns associated with each of said at least two photonic crystals (101, 102).

15 Claims, 4 Drawing Sheets

PHOTONIC CRYSTAL LED

FIELD OF THE INVENTION

The present invention relates to a light emitting diode, comprising photonic crystals.

BACKGROUND OF THE INVENTION

In the modern society of today, the use of light emitting diodes emitting visible light is wide spread. Applications of light emitting diodes include light emitting signs, such as exit signs or emergency signs, lights for vehicles, such as breaking lights, backlight illumination for large scale video displays and illumination systems for furniture, such as shelves. However, the use of light emitting diodes for applications like projection sources or car headlamps is growing less rapidly, due to the fact that the emission angle of a generic light emitting diode is wide. For these applications, it is desired to use a light source having highly collimated light.

Many light emitting diodes (LEDs) suffer from poor extraction efficiency, i.e. the amount of light escaping from a light emitting diode (LED) compared to the light generated in the LED is small. A common problem of LEDs is that total internal reflection of the light in the LED material causes the light to be trapped within the LED and, hence, it does not escape from the LED. One cause of total internal reflection is that there is a large difference in index of refraction between the light emitting material and air. The light being trapped within the LED will eventually be absorbed and lost. In order to reduce the amount of light trapped due to total internal reflection, a method for increasing extraction efficiency has been proposed. The method achieves improved extraction efficiency by providing roughened areas at the light emitting surface of the LED. Yet further improvement of the extraction efficiency has been achieved by means of providing periodic structures in the LED material. An example of a periodic structure is a photonic crystal (PC). By arranging the photonic crystal close to the active region of the LED, an improvement of the extraction efficiency is obtained. The photonic crystal forms gaps (or cavities), which diffract the light at a certain angle. For purposes of theoretical modeling, the light emission (radiation field) of an LED is divided in a near field, which comprises the electric field near the active layer and the photonic crystal structure and a far field, which corresponds to the actual light emission observed (further away) from the LED. A problem of many light emitting diodes, having a photonic crystal structure, is that the far field emission of the LED displays a regular pattern of brighter and/or darker spots, dots or alike.

In US-patent application 2005/0173714 A1, there is disclosed an epitaxial structure of a solid state lighting system. The solid state lighting system comprises an active layer emitting light in response to current injected into the layer, a first structure adjacent to the active layer, wherein the structure and the active layer is arranged to trap the light generated by the active layer and guide the light in parallel to the active layer, and a second structure arranged on top of the guiding layer intended for extracting the light that is trapped by the first structure, wherein the second structure comprises a plurality of photonic crystal arrays with different parameters. Furthermore, there are many photonic crystals cells in each lighting system. According to one embodiment, the geometrical shapes of photonic crystal cells and electrodes in a chip, are arranged in the form of square cells. Each cells has an electrode, which is non-transparent, and comprising a photonic crystal for extraction of light. An object of the solid state lighting system, disclosed in 2005/0173714 A1, is to provide improved extraction efficiency.

In a solid state lighting system of this type, the photonic crystal cells are repeated over the surface of the lighting system. A disadvantage with such a solid state lighting system is that a combined far field pattern, emanating from a plurality of photonic crystal cells, may be non-uniform, i.e. the far field pattern may have bright spots, dots, circles or alike.

SUMMARY OF THE INVENTION

An object of the present invention is to alleviate at least some of the above-mentioned problems of the prior art.

This object is met by the light emitting diode as set forth in the independent claim 1. Specific embodiments are defined in the dependent claims.

According to an aspect of the invention, there is provided a semiconductor light emitting diode (LED), comprising a first and a second electrode for applying a voltage across an active region. The active region is disposed between a first type semiconductor layer and a second type semiconductor layer for generation of light. The LED further comprises a light emitting surface for emitting the light and a plurality of photonic crystals disposed between the active region and the light emitting surface. At least two photonic crystals of a first and a second type, selected among said plurality of photonic crystals, are adapted to extract light from said active region and differ from each other with respect to at least one lattice parameter. Each of said at least two photonic crystals are associated with a respective far field pattern. Furthermore, an arrangement of said plurality of photonic crystals is provided to arrange said at least two photonic crystals, such that an overall far field pattern from the light generated in the LED is created by combining said respective far field patterns associated with each of said at least two photonic crystals.

An idea of the invention is to provide a light emitting diode, having a light emitting area, which is divided into sub-areas. At least some of the sub-areas are provided with different photonic crystals (PCs), the photonic crystals being different in that at least one of their respective lattice parameters (including lattice type, lattice pitch, fill-fraction and lattice orientation as explained further below) differs from each other. The sub-areas act as many different light sources, wherein each light source has a different radiation pattern (or radiation field). In the far field, the different radiation patterns, associated with each corresponding light source (i.e. photonic crystal), are combined into one pattern that may have an improved uniformity compared to a far field pattern, emanating from an LED with, for example, identical photonic crystals, or that may have a collimated light emission with improved symmetry.

Using other wording, a principle forming a basis for the light emitting diode according to the present invention is to provide an LED comprising photonic crystals of at least two different types. Two photonic crystals that differ from each other with respect to at least one lattice parameter are regarded as being of different types. The photonic crystals of different types form an arrangement of photonic crystals, such that the overall far field pattern of the light emitted from the LED is more uniform than each of the individual far field patterns associated with the photonic crystals of different types. In this manner, the influence from darker and/or brighter spots, dots and/or alike, hereinafter referred to as irregularities of the far field pattern, is reduced. It has been observed that the irregularities of the far field patterns, in the prior art LEDs with PCs, result from regular distribution of the cavities (holes) in the photonic crystals. Further, it may be noted that the irregularities correspond to the symmetry in the pattern of the photonic crystal. Thus, it is desired to break the regularity of the distribution of the holes in the PCs as described in the disclosure of this application.

Thus, an advantageous effect of the light emitting diode according to the present invention is that it provides light emission, whose far field radiation pattern may have an improved uniformity or displays less spots (irregularities) than with only one type of photonic crystal.

A further advantage is that many different far field radiation patterns, as required by any specific application, may be designed with a fixed number of optimized photonic crystals. A different design may be obtained by selecting a different arrangement of the photonic crystals of the LED, i.e. the positions of the photonic crystals are changed. For example for backlight applications, it is desired to provide an LED that has the bulk of the emission between 60° and 80° to a normal of the LED.

It is to be noted that the photonic crystals may be formed as a part of the semiconductor layer closest to the light emitting surface. The photonic crystal layer may extend from the light emitting surface through mentioned semiconductor layer closest to the light emitting surface, possibly also through the active region. Further, the photonic crystal layer may extend into the semiconductor layer at the opposite side of the active region compared to the light emitting surface of the LED. The photonic crystals may, however, also be formed in a separate layer different from the semiconductor layer closest to the light emitting surface. In general, a photonic crystal comprises a lattice of holes, poles and/or alike. In the following (and foregoing), mentioning of holes is to be interpreted as holes and/or poles and/or alike.

The photonic crystals may comprise photonic quasi-crystals in some embodiments. In addition, in other embodiments, the light emitting surface of the LED may further comprise means for roughening of the light emitting surface of the LED. In this manner, the means for roughening of the light emitting surface provides a uniform background emission, which reduces contrast between areas provided with photonic crystals and areas not provided with photonic crystals.

In an embodiment of the LED according to the present invention, it is preferred that the arrangement of photonic crystals arranges (positions or locates) the different photonic crystals in a random manner. The arrangement may, in addition or alternatively, arrange the different photonic crystals in a varying (with respect to at least one lattice parameter) manner. For example, a lattice parameter may be varied according to a linear function (or a function of any type and/or order) from one photonic crystal to another (adjacent) photonic crystal, such that uniformity of the far field pattern of the light emitted from the LED is improved. Furthermore, the arrangement of photonic crystals may, in addition or alternatively, arrange the photonic crystals of different types aperiodically within the light emitting surface (more particularly within the semiconductor layer between the active region and the light emitting surface), whereby a combined far field pattern from the different photonic crystals is improved, i.e. there are less or reduced spots or alike.

In embodiments of the LED according to the present invention, the arrangement is arranged to position the above-mentioned photonic crystals of at least two different types in an irregular manner within the light emitting surface. It has, thus, been observed that an overall far field pattern of the light emitted from the LED, having an increased uniformity, may be obtained by arranging, preferably irregularly as above, the different photonic crystals within the light emitting surface (light emitting area), such that the different far field patterns of the associated different photonic crystals interact in such a manner that irregularities (brighter or darker spots or dots or circles) of a far field pattern associated with a photonic crystal occur at different positions with respect to irregularities (brighter or darker spots or dots or circles) of another far field pattern associated with another photonic crystal (or, expressed differently the far field patterns of associated photonic crystals shall preferably be at least partly non-corresponding with respect to their respective spatial extensions). In yet other words, the far field patterns of associated photonic crystals should, preferably, be at least slightly out of phase with each other.

In still further embodiments of the LED according to the present invention, it may be desirable to position (arrange or locate) the photonic crystals of different types in a regular manner. Notably, the brighter and/or darker spots in the far field patterns from the photonic crystals must overlap sufficiently, such as to provide an emitted power in a solid angle within a specific range. For example, when using photonic crystals of different lattice types, such as hexagonal and triangular lattices, the spots in the far field patterns may overlap, and, thereby render a far field pattern with fewer and/or less distinct (blurred) irregularities (spots etc.).

Furthermore, the lattice parameters may be one of lattice orientation, lattice pitch, lattice type or fill fraction or a combination thereof. It shall be noted that the term "lattice parameter" includes lattice orientation, i.e. two photonic crystals are regarded as being different (or different types), if they are oriented differently, even if they have the same pitch, fill fraction and lattice type. For example, the photonic crystals may have the same or similar short-range order, but slightly different pitch, or the same or similar pitch, but different fill fraction. Further, the photonic crystals may have the same (or similar) pitch and shape, but being different in that the lattice type is different, i.e. a hexagonal structure is different from a triangular (or cubic) lattice structure. It is to be observed that some of the photonic crystals may have the same lattice parameters, i.e. it is not required that all the photonic crystals of the LED have at least one different lattice parameter.

It is to be understood that the term "fill fraction" refers to the dimensions of the photonic crystal constituents, such as holes, poles or alike, i.e. the diameter of the holes differ from one photonic crystal to another photonic crystal while the other parameters like pitch are kept constant. Typically, the diameter of the holes (or poles) is in the range of 30 nm to 700 nm for visible light.

The pitch (or the lattice constant) of a photonic crystal is defined as the distance from the center of a hole (or pole or alike) to the center of an adjacent hole in the photonic crystal lattice. For visible light, this distance is typically in the range from 80 nm to 800 nm. In general, the optimal pitch (or lattice pitch) increases with the wavelength of the emitted light.

In embodiments of the LED according the present invention, the pitch and fill fraction of the LED may be varied by means of filling the holes (or gaps between poles) in the semiconductor material with a material, whose refractive index is different for air and the semiconductor material. For example, (porous) silica, tantalum-, zirconium- and titanium oxide may be used. By increasing the refractive index in the holes, the pitch and fill-fraction of the photonic crystal are increased.

The above-mentioned lattice type may comprise at least one of a hexagonal, triangular and cubic structure. Many types of crystal structures are known in the art, which all may be used in the LED according to embodiments of the invention. The above-mentioned low order structures (hexagonal structure etc.) are not intended to limit the scope of the invention to these types. Any low order structure may be employed. High order structures, such as sunflower structure or different types of Archimedean tiling may also be used. Even random crystals structures may be applicable. Preferably, the lattice type provides a non-rotational symmetric far field pattern. An example is quasi-crystals like the spiral structure in the sunflower, which are suitable for applications like beamers, LCD back lights and car front lights. It shall, however, be observed that, in some embodiments, is it preferred to have a rotationally symmetric far field pattern. This is the case for applications like spot lights.

In a further embodiment of the LED according to the present invention, size and shape (dimensions) of the sub-areas, i.e. the shape of the photonic crystals, may be chosen at will. Notably, the smallest size of a sub-area (or photonic crystal) depends on the interaction length of a specific photonic crystal. Preferably, the shape of the sub-areas may be of polygonal shape, such as rectangular, triangular, square shape or a combination thereof. Most preferably, the sub-areas have the same shape. In general, the sub-areas are of square shape, in order to facilitate the manufacturing process.

In other embodiments of the LED according the present invention, the first type semiconductor layer is an N-type semiconductor layer and the second type semiconductor layer is a P-type semiconductor layer. Advantageously, since the N-type material usually is a better current conductor than the P-type semiconductor material, current spreading over the whole active region is achieved, and, thus, the entire active region may be used to generate light and the entire light emitting, top surface may be used to extract light.

Additionally, the N-type layer is disposed between the active region and the light emitting surface of the LED, and the P-type layer is disposed on the opposite side of the active region compared to the N-type layer.

Alternatively, in embodiments of the LED according the present invention, the first type semiconductor layer is a P-type semiconductor layer and the second type semiconductor layer is an N-type semiconductor layer.

Moreover, the photonic crystals are arranged adjacent to each other for continuously covering at least a portion of the light emitting surface of the LED with photonic crystals. Advantageously, the influence of the photonic crystals is maximized in this manner. The application of photonic crystals contributes to increased extraction as well as improved beam shape and collimation efficiency.

In further embodiments of the LED according to the present invention, the second electrode comprises sub-electrodes, disposed on the opposite side of the active region compared to the light emitting surface. A first and a second sub-electrode are associated with a respective photonic crystal of the first and second type, respectively. Further, the first and second sub-electrodes are individually controllable by means of applying a respective voltage to each of the first and second sub-electrodes, whereby the far field pattern of said LED is dynamically controllable due to difference between far field patterns from said photonic crystals of a first and a second type. In this manner, a number of active sub-regions (or sub-"active regions") are created. These active sub-regions may be activated by application of a voltage thereon. As a result different portions of the active region may be activated by selecting (activating) different sub-electrodes. Advantageously, the LED may dynamically (without any need for hardware changes) provide different types of beam shapes (far field patterns), e.g. one type of beam shape (with collimated light) for reading and another type of beam shape (with broad emission) for watching television. Some beam shapes may even direct the emission completely towards the sides without any light in the direction of a normal to the LED.

More particularly, the sub-electrodes may be associated with a respective photonic crystal. It is preferred to match the size and shape of the sub-electrodes to the size and shape of the respective photonic crystal. In this manner, easier and more predictable control of the far field emission may be provided. It shall be noted that some of the electrodes may be associated with a surface area of the LED that does not contain a photonic crystal, but that surface area may have been treated by other techniques like roughening to obtain a homogeneous emission pattern.

Hence, according to the above mentioned embodiment of the present invention, there is provided an LED, in which one of the electrodes is divided into sub-electrodes, wherein each sub-electrode is individually controllable by means of applying a voltage at each one of the sub-electrodes. An advantage with this embodiment is that the intensity distribution (brightness) of the light emitted from the LED may be controlled by selecting different voltages (also no voltage at all is a possible option) for different sub-electrodes.

Furthermore, heat transfer from the active region may be improved. This may be obtained by, for example, only activating a portion of the entire active region, which generates light. A portion where light is generated may be called an active site and a portion of the active region that is not generating light may be called a deactivated site (the associated sub-electrode is deactivated). When the active site is driven to emit light, it also generates heat. This heat may be dissipated in the surrounding deactivated sites, which thus provides local heat dissipation. In this manner, a higher current through the activated site may be applied than when the all sub-electrodes are addressed and there are no deactivated sited present for providing local heat dissipation.

In yet further embodiments of the LED according to the present invention, the first type semiconductor layer, being disposed on the opposite side of the active region compared to the light emitting surface, is divided into sub-elements, each sub-element being associated with a corresponding sub-electrode. Advantageously, improved separation between the active regions for generation of light is achieved.

Those skilled in the art realize that different features of the present invention may be combined to create embodiments other than those described in the following, without departing from the scope of the present invention, which is defined by the appended independent claim.

BRIEF DESCRIPTION OF THE DRAWINGS

The various aspects of the invention will be readily understood from the following detailed description of embodiments of the present invention, which are provided as non-limiting examples, and the accompanying drawings, in which.

DETAILED DESCRIPTION OF EMBODIMENTS

Figure 1:
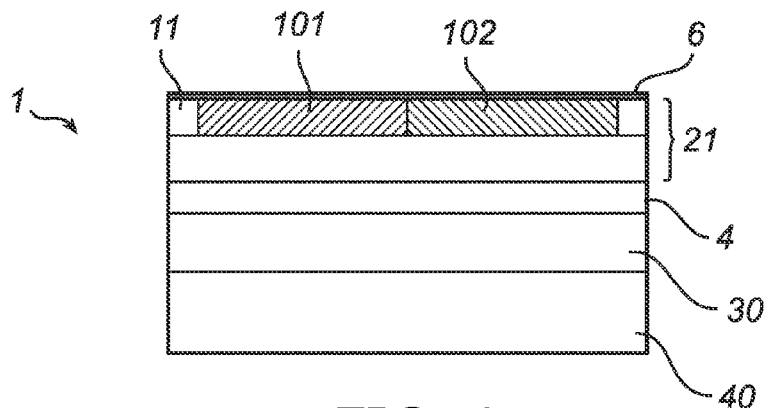
FIG. 1 shows a cross-sectional view of a light emitting diode according to an embodiment of the present invention.

In the following Figures, similar reference numerals have been used for similar parts or features throughout the description when applicable.

In FIG. 1, there is shown an exemplifying light emitting diode 1 (LED) according to an embodiment of the present invention. The LED 1 comprises a semiconductor stack of epitaxial layers 21, 30. In this particular example, the semiconductor stack has a total thickness of 400 nm and is manufactured from GaN. The stack comprises (from bottom to top according to FIG. 1) a first electrode 40, a P-type semiconductor layer 30 in connection with the first electrode 40, an active region 4, an N-type layer 21, a second electrode 11 (or electrode arrangement) in connection with the N-type layer 21 and a light emitting area (light emitting surface) 6. The photonic crystals 101, 102 are formed as holes in the N-type layer 21. The thickness of the photonic crystal layer 101, 102 may be increased such as to extend into the active region (quantum wells) and/or into the P-type layer. The size (diameter) of the holes for photonic crystal type 101 in the N-type layer 21 is, in this example, approximately 100 nm and the depth of the holes is 250 nm. The lattice pitch of the photonic crystal of type 101 is 470 nm. The size (diameter) of the holes for the other type of photonic crystal 102 in the N-type layer 21 is 120 nm and the depth of the holes is 250 nm. The lattice pitch of the photonic crystal of type 101 is 490 nm. The lattice type of photonic crystals 101, 102 is hexagonal lattice type (for other examples the lattice type may be different). The areas of the photonic crystals have hexagonal shape and have a diameter of approximately 50 μm in diameter (not shown). Even though not shown, the number of photonic crystals areas on the LED in FIG. 1 is, normally, in the range from 50 to 2500 for a light emitting surface of 1 mm².

When operating the LED in FIG. 1, a voltage is applied across the active region 4 by setting two different potential levels at the first 40 and the second 11 electrode. In this manner, the active region 4 generates light, which is emitted through the light emitting surface 6 of the LED 1.

FIGS. 2a to 2f illustrate how different far field patterns from areas, comprising photonic crystals of different types add-up (interfere or combine) for improving uniformity of the overall far field, resulting from the light emitted from the entire LED.

Figure 2A:
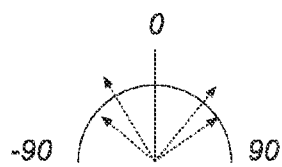
FIGS. 2a and 2b show far field patterns from a respective type of photonic crystal.
Figure 2B:
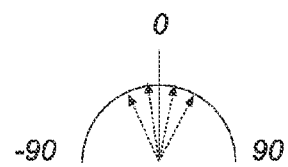

In FIG. 2a and FIG. 2b, there are shown two different far field patterns, wherein each pattern corresponds to a respective type of photonic crystal. The indications −90, 0 and 90 refer to degrees from a normal axis of an LED, placed at the center of the semi circle in FIG. 2a and FIG. 2b, respectively. The far field pattern in FIG. 2a is brighter closer to the periphery of the far field pattern as indicated by the lines originating from a center of the semi circle, whereas the far field pattern in FIG. 2b is brighter near the center of the far field pattern, similarly as indicated by the lines originating from a center of another semi circle.

Figure 2C:
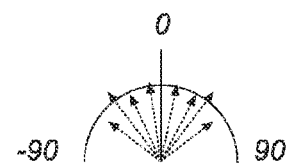
FIG. 2c and FIG. 2f illustrate interference between different far fields originating from areas having photonic crystals of different types, as shown in FIG. 2a-2b and FIG. 2d-2e.
Figure 2D:
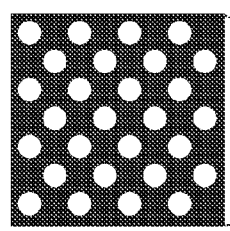
FIGS. 2d and 2e show two photonic crystals, being different with respect to at least one lattice parameter.
Figure 2E:
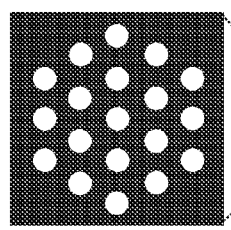

The far field patterns of FIGS. 2a and 2b are associated with a respective type of phonic crystal, which are shown in FIG. 2d and FIG. 2e, respectively. In this example, the photonic crystals differ from each other with respect to the lattice type. The photonic crystal in FIG. 2d is formed of a triangular lattice type (structure) and the photonic crystal in FIG. 2e is formed of a hexagonal lattice type. Other combinations of lattice types, pitch or fill fraction are also possible.

Figure 2F:
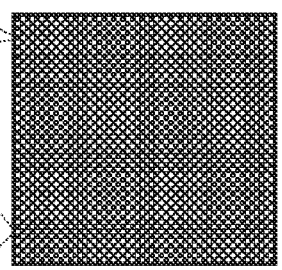

In FIG. 2f, an LED, comprising the photonic crystals, which are illustrated in FIGS. 2d and 2e, is shown. The orientation of at least some photonic crystals, as illustrated in FIG. 2d, are different. For the sake of clarity, only two types of photonic crystals are shown, but in order to obtain a far field pattern with an increased uniformity it is preferred to use more than two types of photonic crystals. The exact number of photonic crystal types required depends on the application and the required homogeneity of the far field. For many applications between 5 and 15 different photonic crystals will be enough to obtain the required far field emission.

The far field pattern, resulting from the light emitted by the LED according to FIG. 2f, is displayed in FIG. 2c. It can be seen that the far field pattern of the photonic crystal of FIG. 2d and the far field pattern of the photonic crystal of FIG. 2e together generates a far field pattern that is more uniform than the individual far field patterns shown in FIG. 2a and FIG. 2b. The brighter areas of the different far field patterns are non-coincidental, i.e. the brighter areas of the patterns are non-overlapping or out of phase. It is to be understood that the introduced, improved, overall far field pattern of the LED, arising from the positions of the areas, which generate different emission patterns in the far field, is decoupled from the location of the individual photonic crystals. Hence, the individual properties of the photonic crystals of the LED is not shown in the overall far field pattern of the LED.

Figure 3:
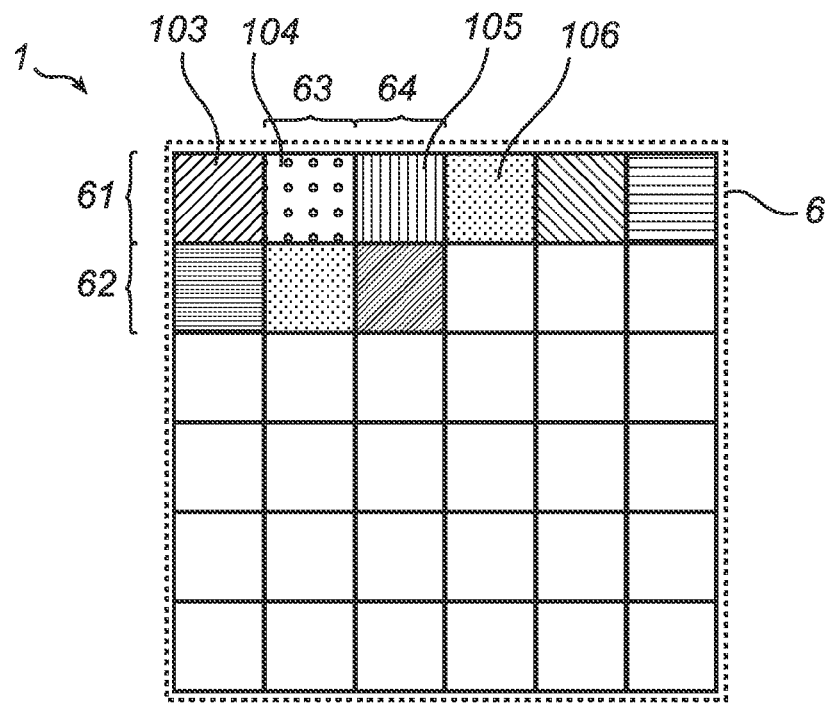
FIG. 3 shows a top, plan view of a light emitting diode according to another embodiment of the present invention.

Referring to FIG. 3, there is shown a top, plan view of a light emitting diode 1 according to an embodiment of the invention. The light emitting surface is partitioned into several sub-segments 61, 62, 63, 64, each sub-segment comprising a photonic crystal 103, 104, 105, 106, which completely covers the corresponding sub-segment. For the sake of simplicity, all sub-segments and all photonic crystals have not been assigned a reference numeral. For a light emitting surface 6 of approximately 1 mm², it is preferred to partition the light emitting surface 6 into approximately 100 to 2500 sub-segments. For larger light emitting surfaces the number of sub-segments may be increased. The photonic crystals of the different sub-segments have different properties (lattice parameters). For example, the sub-segments (or areas) having small dots denote photonic crystals with a certain diameter of the holes (or poles), whereas the sub-segments having small circles denote photonic crystals with another certain diameter of the holes (or poles), i.e. different fill fractions. Moreover, the vertically lined areas denote photonic crystals with a specific orientation, whereas the areas lined in other directions denote photonic crystals with another specific orientation. It is understood that all sub-segments are provided with a photonic crystal, even though the photonic crystals are not illustrated by sub-segments having a specific pattern in FIG. 3. The different photonic crystals are arranged in a varying manner, such that the far field patterns of adjacent photonic crystals improve uniformity of the overall far field pattern from all of the photonic crystals within the light emitting surface 6 (or more particularly in the N-type layer).

In another working example, the different photonic crystals are rotated with respect to its neighbors (all other lattice parameters are the same for the photonic crystals). This is only possible if the far field pattern exhibits rotational asymmetry, i.e. the far field pattern should, for example, not comprise concentric circles centered with respect to a center of the far field pattern. However, if the far field pattern is hexagonal, it may be rotated such that it is identical to the appearance before rotation, i.e. a rotational symmetry angle exists for that particular far field pattern. For such a far field pattern, it is important to select the angle of rotation in such a manner that the angle of rotation is different from the above-mentioned rotational symmetry angle.

Figure 4:
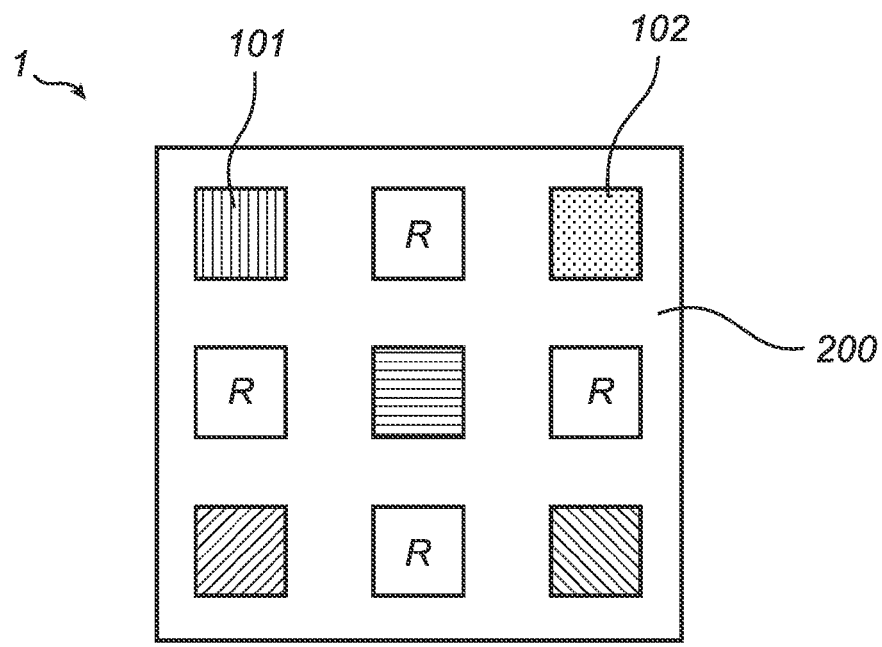
FIG. 4 shows a top, plan view of a light emitting diode according to a further embodiment of the present invention.

According to the LED 1, as shown in FIG. 4, the different sub-segments 101, 102, comprising photonic crystals, are spaced apart from each other. An area 200 between the photonic crystals is formed. Light may be emitted from the area 200. It is preferred that the area 200 is as small as possible, or even non-existent (as in FIG. 3). In FIG. 4, the different sub-segments 101, 102 are in the shape of squares, but other shapes, such as rectangular or hexagonal may also be possible to use. It is even possible to use a more or less random polygonal shape of the photonic crystals. Furthermore, in FIG. 4, there are shown roughened areas R disposed in between the photonic crystals 101, 102, which photonic crystals 101, 102 are different from each other with respect to at least one lattice parameter.

Figure 5:
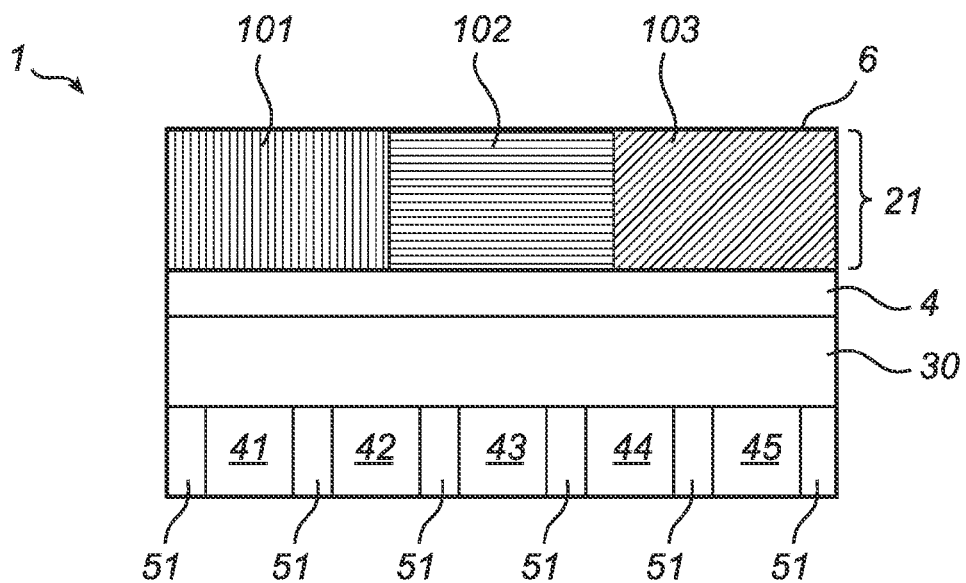
FIG. 5 shows a cross-sectional view of a light emitting diode according to yet another embodiment of the present invention.

Now referring to FIG. 5, there is illustrated a further exemplifying embodiment of the present light emitting diode 1. The cross-sectional view of the light emitting diode 1 demonstrates the constituents of a light emitting diode according embodiments of the present invention (from top to bottom, omitting some components for the sake of clarity); an N-type layer 21 comprising PCs 101, 102, 103, a P-type layer 30 and an active region 4. In this example, the N-type layer comprises the PCs, but it shall be noted that the photonic crystal layer may extend into the active region and, possibly, into the P-type layer as well. Further, the LED 1 comprises an electrode layer, which is horizontally separated into a number of sub-electrodes 41-45. In other words, the bottom, reflective electrode layer is divided into a number of sub-electrode layers 41, 42, 43, 44, 45, being separated by non-conducting barriers 51. In this example, it is preferred to use essentially the entire depth of the N-type layer for the holes and poles, making the photonic crystals 101, 102 and 103. It is, hence, preferred that the photonic crystal layer extends as far into the N-type layer as possible. For most applications, an N-type layer of less than one micrometer in thickness, comprising a photonic crystal structure of approximately the same depth, is desired. The barriers 51 extend from, and including, the bottom sub-electrodes 41-45 up to, but not including, the P-type layer 30. The sub-electrodes 41-45 are individually controllable for activation of different portions of the active region. Consequently, different photonic crystal structures will be activated when different portions of the active region is activated. In this manner, the far field pattern of the entire LED 1 may be controlled dynamically.

Figure 6:
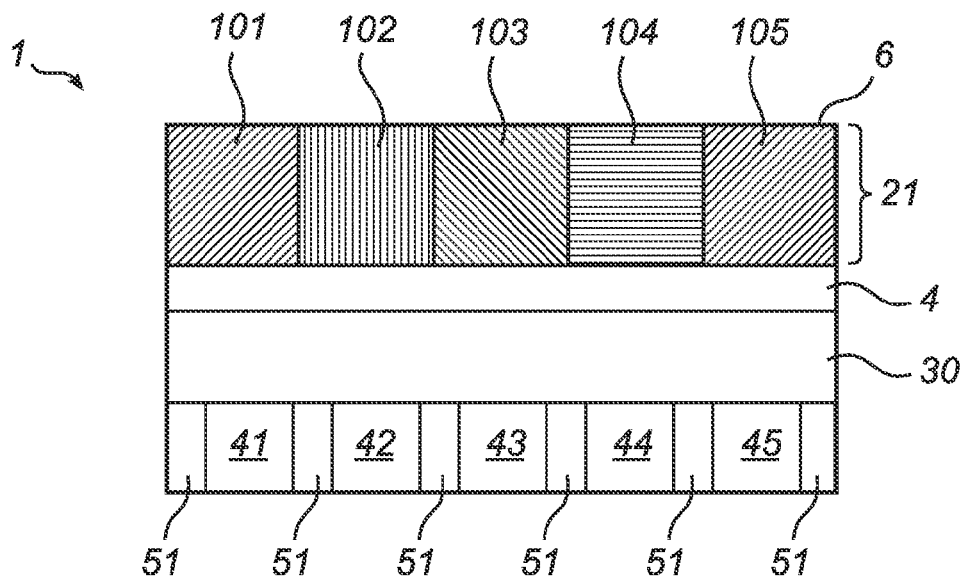
FIG. 6 shows a cross-sectional view of a light emitting diode according to a still further embodiment of the present invention.

As being displayed in FIG. 6, in a further example of the LED 1 according to the present invention, the photonic crystals have a size and shape that matches the size and shape of the sub-electrodes 41-45. In addition, the photonic crystals are aligned such that each photonic crystal corresponds to a matching sub-electrode. Since each sub-electrode, having a corresponding active region portion, may be activated individually, an increased control of the far field pattern is provided.

Figure 7:
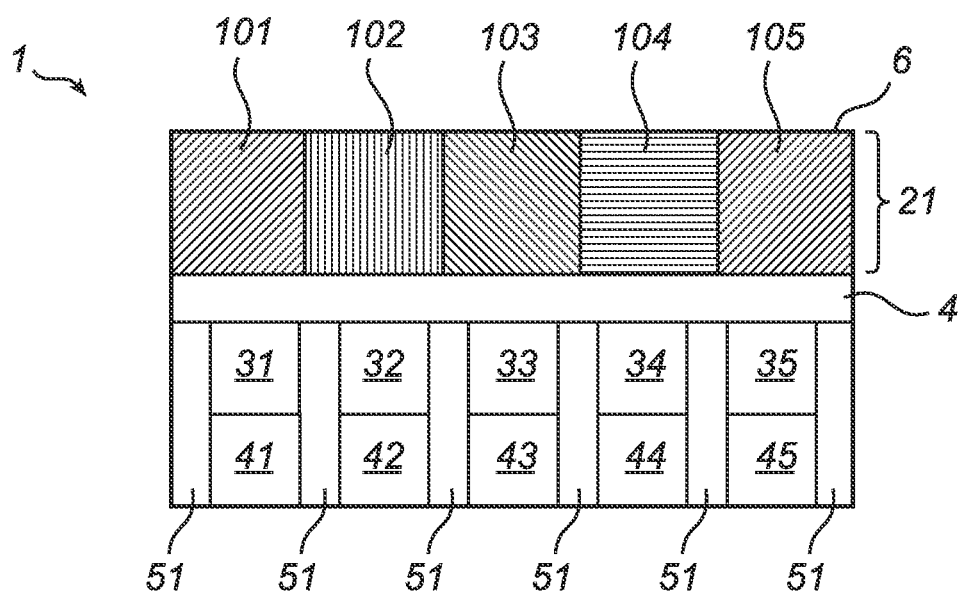
FIG. 7 shows a cross-sectional view of a light emitting diode according to an embodiment of the present invention.

With reference to FIG. 7, there is illustrated a further working example of the LED 1 according to the present invention. This example is similar to the LED shown in FIG. 6 with the addition of separation of the P-type layer into sub-regions of the P-type layer. Even though the current spreading in the P-type layer from the sub-electrodes 41-45 is very limited, it is possible to improve the separation of the active regions by dividing the P-type layer into sub-regions as follows. The LED 1 further comprises a P-type layer, which is horizontally separated into a number of sub-regions 31-35. In other words, the P-type layer is divided into a number of sub-P-type layers 31, 32, 33, 34, 35, being separated by non-conducting barriers 51. The barriers 51 extend from, and including the bottom electrode up to, but not including, the active region 4. The sub-electrodes 41-45 (and the corresponding sub-regions of the P-type layer) are individually controllable for activation of different portions of the active region. As in the previous working example, different photonic crystal structures will be activated when different portions of the active region is activated. Thereby, the far field pattern of the entire LED 1 may be controlled dynamically. In other examples of the sub-electrode configuration, the sub-electrodes may be grouped into, for example, three groups, which groups are individually controllable for selecting a far field pattern associated with a respective group of sub-electrodes and their corresponding photonic crystals. Even though the invention has been described with reference to specific examples thereof, many different alterations, modifications and the like will become apparent for those skilled in the art. The described examples are therefore not intended to limit the scope of the invention, as defined by the appended claims.

The invention claimed is:

1. A semiconductor light emitting diode (LED), comprising:
a first and a second electrode for applying a voltage across an active region, disposed between a first type semiconductor layer and a second type semiconductor layer for generation of light, a light emitting surface for emitting said light, and a plurality of photonic crystals disposed between said light emitting surface and said active region, each photonic crystal comprising a plurality of holes formed in a top semiconductor layer in the LED, characterized in that at least two photonic crystals of a first and a second type, selected among said plurality of photonic crystals, are adapted to extract light from said active region and differ from each other with respect to at least one lattice parameter, each of said at least two photonic crystals being associated with a respective far field pattern, wherein an arrangement of said plurality of photonic crystals is provided to arrange said at least two photonic crystals, such that a far field pattern from the light generated in the LED is created by combining said respective far field patterns associated with each of said at least two photonic crystals, wherein the first photonic crystal type is confined to a first region of the light emitting surface and the second photonic crystal type is confined to a second region of the light emitting surface, wherein the first and second regions of the light emitting surface are adjacent to each other and do not overlap.

2. The LED according to claim 1, wherein said arrangement is arranged to position said at least two photonic crystals in a manner, such that irregularities of said respective far field patterns associated with each of said at least two photonic crystals are at least partly non-overlapping.

3. The LED according to claim 1, wherein said at least one lattice parameter is one of lattice orientation, lattice pitch, lattice type or fill fraction or a combination thereof.

4. The LED according to claim 1, wherein said lattice type comprises at least one of a hexagonal, triangular, cubic structure, sunflower structure or Archimedean tilings.

5. The LED according to claim 1, wherein said first type semiconductor layer is said top semiconductor layer and is a N-type semiconductor layer, disposed between said active region and said light emitting surface, and said second type semiconductor layer is a P-type semiconductor layer, disposed on the opposite side of said active region compared to said first type semiconductor layer.

6. The LED according to claim 1, wherein said first type semiconductor layer is a P-type semiconductor layer, disposed between said active region and said light emitting surface, and said second type semiconductor layer is a N-type semiconductor layer, disposed on the opposite side of said active region compared to said first type semiconductor layer.

7. The LED according to claim 1, wherein said photonic crystals comprise photonic quasi-crystals.

8. The LED according to claim 1, wherein said light emitting surface of said LED comprises roughened areas.

9. The LED according to claim 1, wherein said photonic crystals are arranged adjacent to each other for continuously covering at least a portion of said light emitting surface of said LED with photonic crystals.

10. A semiconductor light emitting diode (LED), comprising:
a first and a second electrode for applying a voltage across an active region, disposed between a first type semiconductor layer and a second type semiconductor layer for generation of light, a light emitting surface for emitting said light, and a plurality of photonic crystals disposed between said light emitting surface and said active region, wherein at least two photonic crystals of a first and a second type, selected among said plurality of photonic crystals, are adapted to extract light from said active region and differ from each other with respect to at least one lattice parameter, each of said at least two photonic crystals being associated with a respective far field pattern, wherein an arrangement of said plurality of photonic crystals is provided to arrange said at least two photonic crystals, such that a far field pattern from the light generated in the LED is created by combining said respective far field patterns associated with each of said at least two photonic crystals, wherein said second electrode comprises sub-electrodes, disposed on the opposite side of said active region compared to said light emitting surface, wherein a first and a second sub-electrode are associated with a respective photonic crystal of the first and second type, respectively, said first and second sub-electrodes being individually controllable by means of applying a respective voltage to each of said first and second sub-electrodes.

11. The LED according to claim 10, wherein the size and shape of said sub-electrodes matches the size and shape of said respective photonic crystal.

12. The LED according to claim 10, wherein each sub-electrode is aligned with said respective photonic crystal.

13. The LED according to claim 10, wherein said second type semiconductor layer, disposed on the opposite side of said active region compared to said light emitting surface, is divided into sub-elements, each sub-element being associated with a corresponding sub-electrode.

14. The LED according to claim 10, wherein said light emitting surface comprises at least one of micro-lenses, colored areas, luminescent material covered areas or a combination thereof.

15. The LED according to claim 10, whereby the far field pattern of said LED is dynamically controllable due to difference between far field patterns from said photonic crystals of a first and a second type.

* * * * *